US007643252B2

(12) United States Patent
Arai et al.

(10) Patent No.: US 7,643,252 B2
(45) Date of Patent: *Jan. 5, 2010

(54) HEAD SUSPENSION HAVING WIRING DISPOSED WITH CONDUCTIVE LAYER

(75) Inventors: Hajime Arai, Yokohama (JP); Ikuo Someya, Yokohama (JP)

(73) Assignee: NHK Spring Co., Ltd., Yokohama (JP)

( * ) Notice: Subject to any disclaimer, the term of this patent is extended or adjusted under 35 U.S.C. 154(b) by 372 days.

This patent is subject to a terminal disclaimer.

(21) Appl. No.: 11/359,317

(22) Filed: Feb. 21, 2006

(65) Prior Publication Data

US 2006/0187587 A1 Aug. 24, 2006

(30) Foreign Application Priority Data

Feb. 21, 2005 (JP) ............................. 2005-044752

(51) Int. Cl.
G11B 5/48 (2006.01)
(52) U.S. Cl. .................................................. 360/245.9
(58) Field of Classification Search ...... 360/245–245.9, 360/244.3, 244.9, 234.5, 323; 29/603.04
See application file for complete search history.

(56) References Cited

U.S. PATENT DOCUMENTS

| | | | | |
|---|---|---|---|---|
| 5,612,840 A * | 3/1997 | Hiraoka et al. | ............ | 360/245.9 |
| 5,644,454 A * | 7/1997 | Arya et al. | ............... | 360/245.8 |
| 5,657,186 A * | 8/1997 | Kudo et al. | ............... | 360/234.5 |
| 5,710,682 A * | 1/1998 | Arya et al. | ............... | 360/245.8 |
| 5,805,382 A * | 9/1998 | Lee et al. | .................. | 360/244.1 |
| 6,459,043 B1 * | 10/2002 | Dodsworth | .................. | 174/254 |
| 6,487,048 B1 | 11/2002 | Dunn | | |
| 6,700,748 B1 * | 3/2004 | Cowles et al. | ............. | 360/245.9 |
| 6,775,101 B2 * | 8/2004 | Satoh et al. | ............... | 360/234.6 |
| 6,801,402 B1 | 10/2004 | Subrahmanyam et al. | | |
| 6,942,824 B1 * | 9/2005 | Li | ............... | 252/512 |
| 6,947,258 B1 * | 9/2005 | Li | ............ | 360/234.6 |
| 7,031,114 B2 * | 4/2006 | Wu et al. | .................. | 360/234.6 |
| 7,095,590 B2 | 8/2006 | Motonishi et al. | | |

(Continued)

FOREIGN PATENT DOCUMENTS

CN 1497536 5/2004

(Continued)

OTHER PUBLICATIONS

Jan. 31, 2003 ESD assessment of GMR head Shoji Natori IDEMA Japan News 54.

Primary Examiner—Allen T Cao
(74) Attorney, Agent, or Firm—Jordan and Hamburg LLP

(57) ABSTRACT

A head suspension prevents a read element from electrostatic discharge damage without employing a static electricity remover, and at the same time, secures the frequency characteristics of a write signal. The head suspension has a load beam to apply load to a slider that writes and reads data to and from a hard disk, a flexure made of a conductive thin plate attached to the load beam, to support the slider, write wires connected to the slider and formed on an insulating base layer that is made of flexible resin and is formed on the flexure, and coating made of conductive flexible resin to discharge static electricity. The coating is formed over the read wires and is extended to the surface of the flexure.

15 Claims, 3 Drawing Sheets

U.S. PATENT DOCUMENTS

| | | |
|---|---|---|
| 7,193,818 B2 * | 3/2007 | Sato et al. ............... 360/234.6 |
| 2002/0154454 A1 | 10/2002 | Kupinski et al. |
| 2003/0002220 A1 | 1/2003 | Nojima |
| 2003/0062194 A1 | 4/2003 | Dodsworth et al. |
| 2003/0151902 A1 | 8/2003 | Kageyama et al. |
| 2005/0117257 A1 * | 6/2005 | Thaveeprungsriporn et al. . 360/246 |
| 2006/0187587 A1 | 8/2006 | Arai et al. |
| 2006/0190673 A1 * | 8/2006 | Arai et al. .................. 711/101 |

FOREIGN PATENT DOCUMENTS

| | | |
|---|---|---|
| CN | 02122683 | 12/2005 |
| JP | 9-282624 | 10/1997 |
| JP | 10-198935 | 7/1998 |
| JP | 2001-291215 | 10/2001 |
| JP | 2003-6828 | 1/2003 |
| JP | 2003124581 | 4/2003 |
| JP | 2003-203436 | 7/2003 |
| JP | 2004-192672 | 7/2004 |

* cited by examiner

HEAD SUSPENSION HAVING WIRING DISPOSED WITH CONDUCTIVE LAYER

BACKGROUND OF THE INVENTION

1. Field of the Invention

The present invention relates to a head suspension for a hard disk drive installed in an information processing apparatus such as a computer.

2. Description of Related Art

A hard disk drive (HDD) employs a head suspension for suspending a magnetic head to write and read data to and from a magnetic disk. To transfer write and read signals to and from the magnetic head, wires are connected to the magnetic head. The wires are arranged on an insulating base layer that is made of flexible resin and is formed on a flexure, which is a part of the head suspension and is made of a resilient stainless-steel thin plate. The wires are covered with an insulating cover layer made of flexible resin.

When the flexure is assembled into the head suspension, the surface of the insulating cover layer may be rubbed with another part such as a clamp or a tool, to accumulate static electricity. This static electricity is transferred to the wires under the insulating cover layer. If the magnetic head of the head suspension touches a tool or a jig, or if a slider pad and a flexure pad of the head suspension touch each other during a GBB (gold ball bonding) or SBB (stud bump bonding) process, the static electricity accumulated in the wires will move to the magnetic head to deteriorate or destroy a read element of the magnetic head.

Recent hard disk drives employ MR (magnetoresistive) heads and GMR (giant magnetoresistive) heads to improve a read sensitivity. The MR and GMR heads are vulnerable to static electricity and require an electrostatic discharge damage preventive measure.

Unlike the read element, a write element of the magnetic head is resistive to electrostatic discharge because it is generally an inductive magnetic transducer. Instead of the electrostatic discharge damage preventive measure, the write element requires a measure to provide high-frequency signals and sharpen the rises of the signals to improve a write transfer speed.

Simply employing a conductive material to prevent the electrostatic discharge damage will result in lowering the frequency of a write signal and deteriorating write performance.

One measure for preventing the electrostatic discharge damage is to employ an ionizer (static electricity remover). The ionizer needs specific facilities and an additional ion balancing process, to thereby increase costs, as disclosed in Japanese Unexamined Patent Application Publication No. 9-282624 and in Shoji Natori (Hitachi Computer Equipment) "ESD assessment of GMR head," Jan. 31, 2003, Technical Committee, ESD Control Subcommitee.

SUMMARY OF THE INVENTION

An object of the present invention is to provide a head suspension capable of preventing electrostatic discharge damage of a read element without a static electricity remover and securing the frequency characteristic of a write signal.

In order to accomplish the object, an aspect of the present invention provides a head suspension having read wires coated with conductive flexible resin to discharge static electricity. The coating is extended to the surface of a flexure of the head suspension.

The coating on the read wires gradually discharges static electricity from the read wire side to a jig or an apparatus that is grounded, thereby preventing static discharge between the wires and a read element arranged on a slider of the head suspension and protecting the read element from electrostatic discharge damage. Static electricity on write wires has no influence on a write element. The write element is resistive to static electricity, and therefore, needs no electrostatic discharge damage preventive measure. The conductive flexible resin coating on the read wires does not deteriorate the frequency characteristic of a write signal passed through the write wires. Namely, the resin coating does not deteriorate write performance. This aspect of the present invention can eliminate a facility cost for a static electricity remover, omit an ion balancing process, and reduce the total cost of the head suspension.

DETAILED DESCRIPTION OF EMBODIMENTS

A head suspension according to an embodiment of the present invention will be explained. This embodiment practices an electrostatic discharge damage preventive measure on a read side, to prevent electrostatic discharge damage of a read element of a magnetic head without employing a static electricity remover, and at the same time, secure the frequency characteristic of a write signal.

General Structure of Head Suspension

Figure 1:
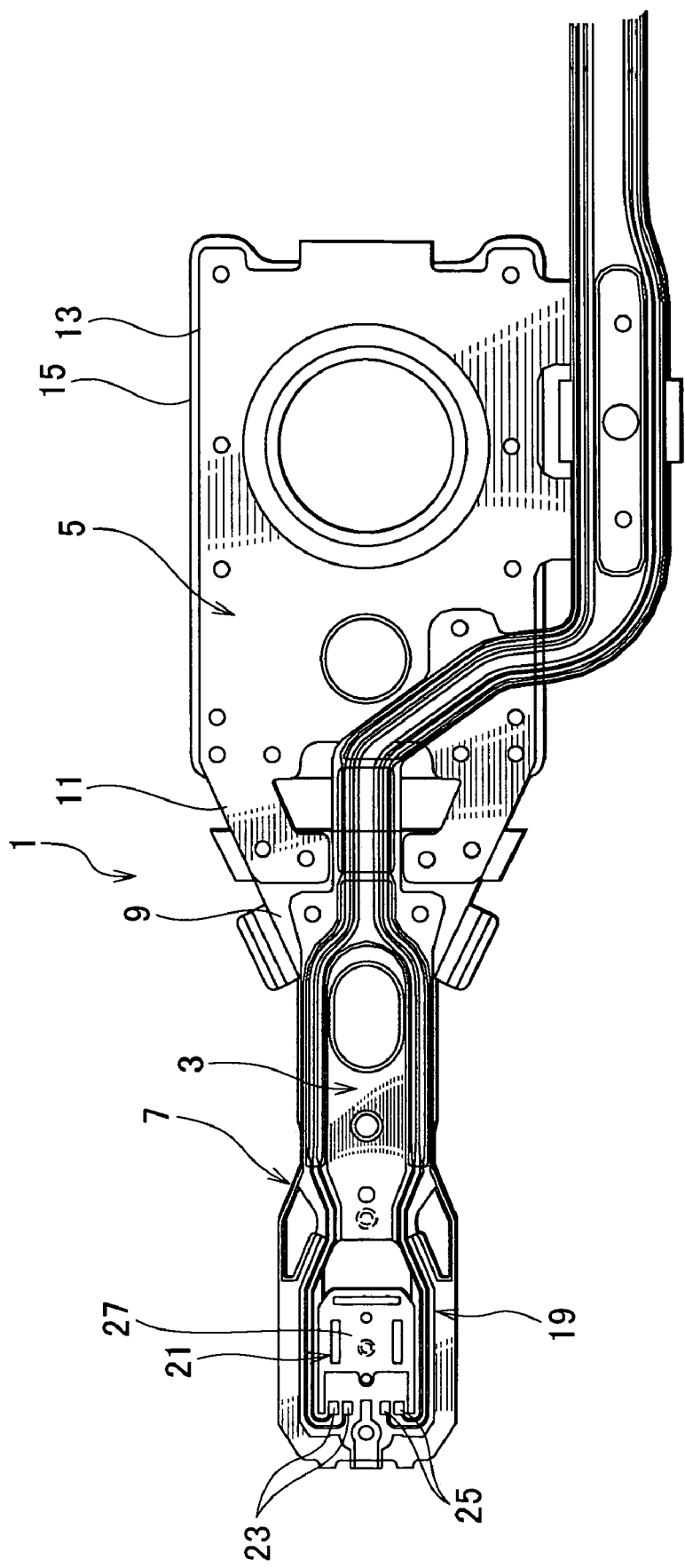
FIG. 1 is a plan view showing a head suspension according to an embodiment of the present invention.

FIG. 1 is a plan view showing the head suspension according to the embodiment.

In FIG. 1, the head suspension 1 has a load beam 3, a base 5, and a flexure 7.

The load beam 3 includes of a rigid part 9 and a resilient part 11, to apply load to a head 21. The rigid part 9 is made of, for example, stainless steel and is relatively thick. The thickness of the rigid part 9 is, for example, about 100 μm.

The resilient part 11 is a separate part from the rigid part 9 and is made of, for example, a resilient thin stainless-steel rolled plate. The spring constant of the resilient part 11 is precise and is lower than that of the rigid part 9. The thickness of the resilient part 11 is, for example, about 40 μm. A front end of the resilient part 11 is fixed to a rear end of the rigid part 9 by, for example, laser welding. A rear end of the resilient part 11 is integral with a reinforcing plate 13.

The base 5 has a base plate 15, which is laid over and fixed to the reinforcing plate 13 by, for example, laser welding. The base plate 15 is strengthened with the reinforcing plate 13, to form the base 5. The base 5 is attached to an arm of a carriage and is turned around a spindle.

The flexure 7 is a conductive thin plate made of, for example, a resilient thin stainless-steel rolled plate (SST) having a thickness of about 30 μm. On the flexure 7, there is an electric insulating layer on which wiring patterns 19 are formed. The flexure 7 is fixed to the rigid part 9 by, for example, laser welding. One ends of the wiring patterns 19 are electrically connected to write terminals 23 and read terminals 25 of the head 21. The other ends of the wiring patterns 19 are extended along the base 5.

The flexure 7 has a cantilever tongue 27 supported with the head 21. The tongue 27 has a write slider and a read slider. The write slider has terminals that correspond to the write terminals 23 and are connected to a write element. The read slider has terminals that correspond to the read terminals 25 and are connected to a read element.

The write element is, for example, a standard inductive magnetic transducer. The read element is a high sensitivity read element such as an MR (magnetoresistive) element, a GMR (giant magnetoresistive) element, or a TuMR (tunneling magnetoresistive) element.

Coating

Figure 2:
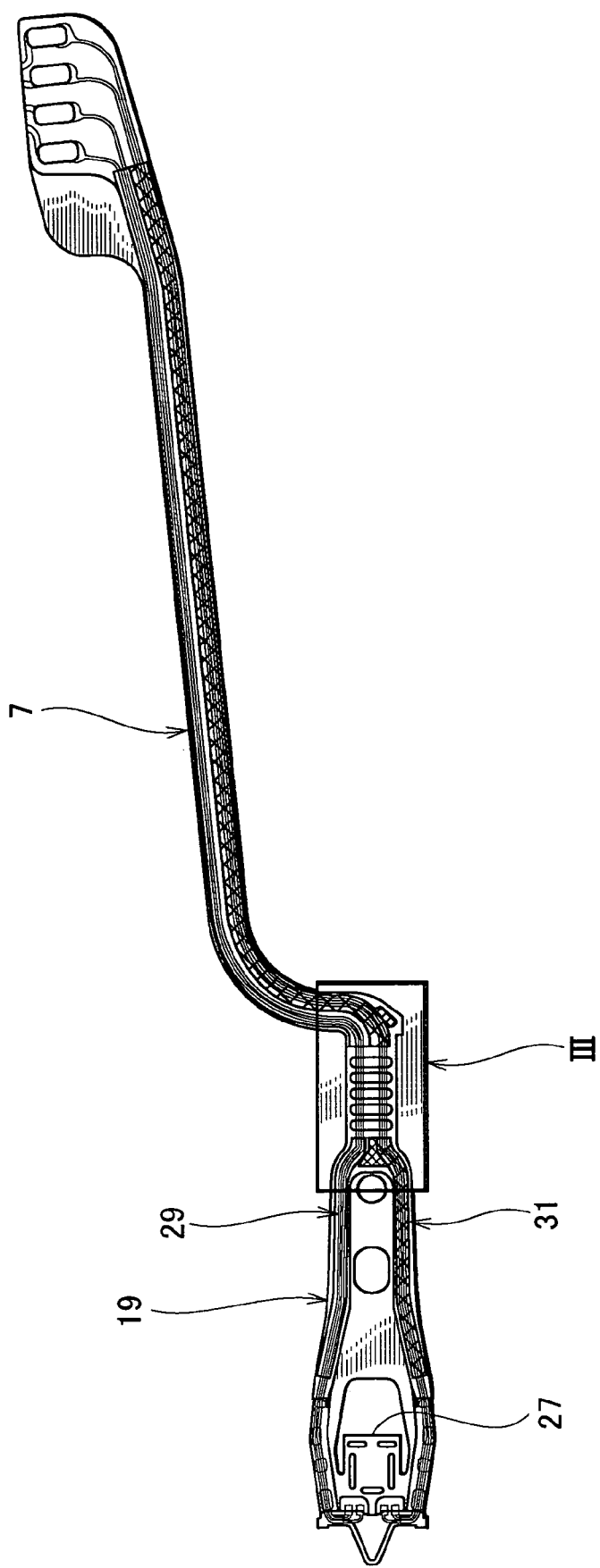
FIG. 2 is a plan view showing a flexure of the head suspension of FIG. 1.
Figure 3:
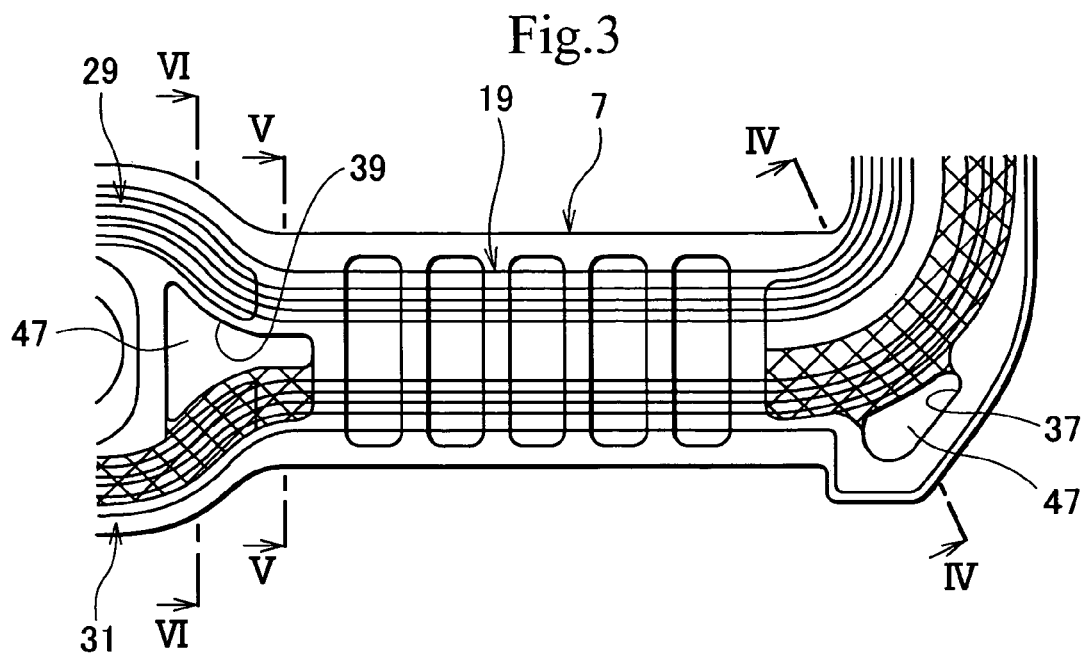
FIG. 3 is an enlarged plan view showing a part III of FIG. 2.
Figure 4:
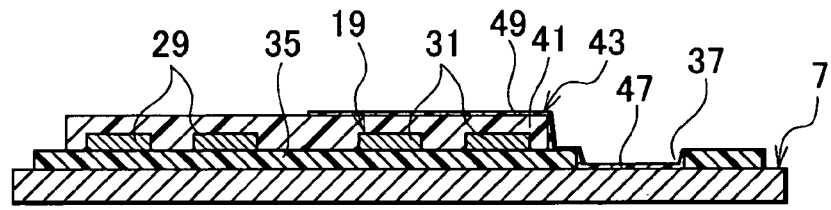
FIG. 4 is a sectional view taken along a line IV-IV of FIG. 3.
Figure 5:
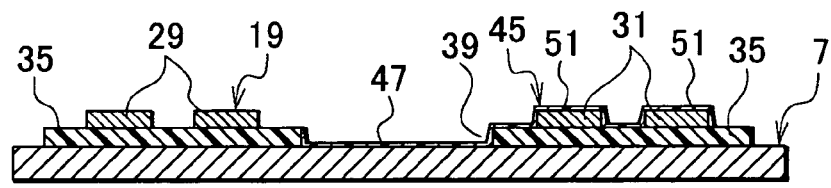
FIG. 5 is a sectional view taken along a line V-V of FIG. 3.
Figure 6:
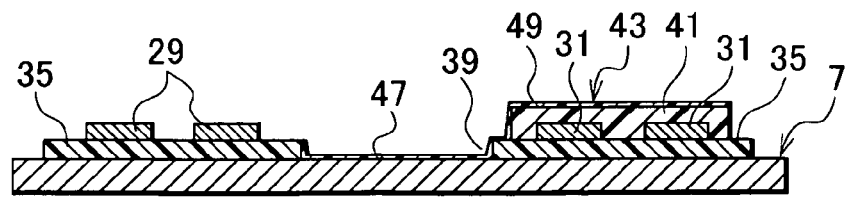
FIG. 6 is a sectional view taken along a line VI-VI of FIG. 3.

FIG. 2 is a plan view showing the flexure 7 having the wiring patterns 19, FIG. 3 is an enlarged plan view showing a part III of FIG. 2, FIG. 4 is a sectional view taken along a line IV-IV of FIG. 3, FIG. 5 is a sectional view taken along a line V-V of FIG. 3, and FIG. 6 is a sectional view taken along a line VI-VI of FIG. 3.

In FIGS. 2 to 6, the wiring patterns 19 include write wires (Write1, Write2) 29 and read wires (Read1, Read2) 31 and are formed on an insulating base layer 35. The base layer 35 is made of flexible resin and is formed on the flexure 7.

The flexible resin of the insulating base layer 35 is polyimide and has a layer thickness of about 10 μm and a surface resistivity of about $10^{14}$ Ω/sq. With this high resistivity, the base layer 35 provides an appropriate insulating capability. The base layer 35 has holes 37 and 39 at proper locations, to partly expose the flexure 7.

The read wires 31 on the insulating base layer 35 are substantially covered with an insulating cover layer 41 having a layer thickness of about 20 μm in a rising direction from the insulating base layer 35. The cover layer 41 covers the surfaces of the read wires 31, to insulate and protect the read wires 31. Like the base layer 35, the cover layer 41 has a surface resistivity of about $10^{14}$ Ω/sq. With this high resistivity, the cover layer 41 achieves an appropriate insulating capability.

Over the read wires 31, there are formed coats or coating 43 and 45 with the use of masks. The coats 43 and 45 are made of conductive flexible resin and are extended to the surface of the flexure 7, to discharge static electricity. The coats 43 and 45 have a layer thickness of about several micrometers and a surface resistivity of $10^4$ to $10^{11}$ Ω/sq. that is intermediate between conductance and non-conductance. Namely, the coats 43 and 45 are sufficiently insulative in terms of circuit operation and are adequately conductive with respect to static electricity.

The coat 43 covers the surface 49 of the insulating cover layer 41 and is extended to the holes 37 and 39. In the holes 37 and 39, the coat 43 covers the surface 47 of the flexure 7 and is grounded thereto.

The coat 45 covers the surfaces 51 of the read wires 31 and is extended to the hole 39. In the hole 39, the coat 45 covers the surface 47 of the flexure 7 and is grounded thereto.

The insulating base layer 35 insulates the write wires 29 and read wires 31 from the flexure 7. The read wires 31 are insulated and protected with the cover layer 41.

Electrostatic Discharge

During an assembling work of the flexure 7, the coat 43 may be rubbed with another part such as a clamp or a tool, to accumulate static electricity. The static electricity in the coat 43 moves through the coat 43 to the surface 47 of the flexure 7 in the holes 37 and 39. From there, the static electricity is discharged to a jig, a tool, or the like that is in contact with the flexure 7.

If the read wires 31 accumulate static electricity through the insulating cover layer 41, the static electricity moves through the coat 45 to the surface 47 of the flexure 7 in the hole 39. From there, the static electricity is discharged to the jig, tool, or the like that is in contact with the flexure 7.

Even if a slider pad touches the read terminals 25 during the assembling work, no static electricity is transferred between the read wires 31 and the slider. Namely, the read element will not be deteriorated or damaged with static electricity. As a result, it is possible to employ, as the read element, an MR element, a GMR element, or a TuMR that is highly sensitive in reading data.

According to the embodiment, the head suspension 1 itself serves as a static electricity remover to eliminate static electricity without using an ionizer. The embodiment, therefore, can reduce a facility cost and the number of manufacturing processes, thereby lowering the total cost of the head suspension.

The conductive coats 43 and 45 are not on the write wires 29, and therefore, do not harm the frequency characteristic of a write signal. Accordingly, the embodiment can secure write performance.

What is claimed is:

1. A head suspension comprising:
a load beam configured to apply load to a slider that writes and reads data to and from a hard disk;
a flexure made of a conductive thin plate attached to the load beam and configured to support the slider;
an insulating base layer formed of a flexible resin disposed on the flexure
write wires and read wires having first ends connected to the slider and second ends disposed distal to the slider and at the load beam, said write wires and said read wires being disposed on the insulating base layer along a length from the first ends to the second ends;
the insulating base layer defining a hole adjacent to said read wires and exposing a flexure surface of the flexure; and
a conductive coating, made of conductive flexible resin, formed over the read wires at a position between the first ends and the second ends and extended to pass through the hole in the insulating base layer and contact the flexure surface of the flexure exposed by the hole, said conductive coating being composed so as to effect discharge of static electricity to the flexure, and said conductive coating being not disposed over the write wires between the first and second ends.

2. The head suspension of claim 1, further comprising an insulating cover layer covering portions of the write and read wires disposed on the insulating base layer; and
the conductive coating being formed on the insulating cover layer at the position over the read wires such that the insulating cover layer separates the conductive coating from the read wires.

3. The head suspension of claim 1, wherein the conductive coating has a surface resistivity in the range of $10^4$ to $10^{11}$ Ω/sq.

4. The head suspension of claim 2, wherein the conductive coating has a surface resistivity in the range of $10^4$ to $10^{11}$ Ω/sq.

5. The head suspension of claim 4 wherein the insulating base layer and the insulating cover layer have a surface resistivity of about $10^{14}$ Ω/sq.

6. The head suspension of claim 3 wherein the insulating base layer has a surface resistivity of about $10^{14}$ Ω/sq.

7. The head suspension of claim 2 wherein the insulating base layer and the insulating cover layer have a surface resistivity of about $10^{14}$ Ω/sq.

8. The head suspension of claim 1 wherein the insulating base layer has a surface resistivity of about $10^{14}$ Ω/sq.

9. The head suspension of claim 1 wherein the conductive coating contacts the read wires at the position between the first and second ends.

10. The head suspension of claim 9, further comprising:
an insulating cover layer covering portions of the write and read wires at another position on the flexure between the first and second ends; and
the conductive coating being formed over the read wires and on the insulating cover layer at the another position such that the insulating cover layer separates the conductive coating from the read wires at the another position.

11. The head suspension of claim 10, wherein the hole is formed at a position adjacent the another position on the flexure, and the insulating cover layer separates the conductive coating from the read wires at areas of the read wires adjacent the hole.

12. The head suspension of claim 11, wherein the conductive coating has a surface resistivity in the range of $10^4$ to $10^{11}$ Ω/sq.

13. A suspension comprising:
a load beam configured to apply load to a slider that writes and reads data to and from a hard disk;
a flexure made of a conductive thin plate attached to the load beam and configured to support the slider;
an insulating base layer formed of a flexible resin disposed on the flexure;
write wires and read wires having first ends connected to the slider and second ends disposed distal to the slider and at the load beam, said write wires and said read wires being disposed on the insulating base layer along a length from the first ends to the second ends;
a conductive coating, made of conductive flexible resin, formed over the read wires between the first ends and the second ends and extended to contact the flexure surface of the flexure, said conductive coating being composed so as to effect discharge of static electricity to the flexure, and said conductive coating being not disposed over the write wires between the first and second ends;
the conductive coating contacting the read wires at a first position between the first and second ends;
an insulating cover layer covering portions of the write and read wires at a second position on the flexure between the first and second ends; and
the conductive coating being formed over the read wires and on the insulating cover layer at the second position such that the insulating cover layer separates the conductive coating from the read wires at the second position.

14. The head suspension of claim 13, wherein the insulating cover layer separates the conductive coating from the read wires at the second position along an area whereat the conductive coating contact the flexure surface.

15. The head suspension of claim 14, wherein the conductive coating has a surface resistivity in the range of $10^4$ to $10^{11}$ Ω/sq.

* * * * *